United States Patent
Reitinger (10) Patent No.: US 12,276,692 B2
(45) Date of Patent: Apr. 15, 2025

(54) CALIBRATION ARRANGEMENT AND CORRESPONDING CALIBRATION METHOD, AND CALIBRATION APPARATUS

(71) Applicant: ERS Electronic GmbH, Germering (DE)

(72) Inventor: Klemens Reitinger, Germering (DE)

(73) Assignee: ERS Electronic GmbH, Germering (DE)

( * ) Notice: Subject to any disclaimer, the term of this patent is extended or adjusted under 35 U.S.C. 154(b) by 76 days.

(21) Appl. No.: 18/006,956

(22) PCT Filed: Jul. 27, 2021

(86) PCT No.: PCT/EP2021/070991
§ 371 (c)(1),
(2) Date: Jan. 26, 2023

(87) PCT Pub. No.: WO2022/023336
PCT Pub. Date: Feb. 3, 2022

(65) Prior Publication Data
US 2023/0280396 A1 Sep. 7, 2023

(30) Foreign Application Priority Data
Jul. 29, 2020 (DE) .............. 10 2020 209 549.3

(51) Int. Cl.
*G01R 31/28* (2006.01)
*G01R 35/00* (2006.01)

(52) U.S. Cl.
CPC ..... *G01R 31/2865* (2013.01); *G01R 31/2874* (2013.01); *G01R 35/005* (2013.01)

(58) Field of Classification Search
CPC ............ G01R 31/2865; G01R 31/2874; G01R 35/005
See application file for complete search history.

(56) References Cited

U.S. PATENT DOCUMENTS 6,124,793 A 9/2000 Knutson
6,825,681 B2 * 11/2004 Feder ................ G01R 31/2874
62/3.1

(Continued)

FOREIGN PATENT DOCUMENTS

DE  10 2009 030 471 A1  1/2010
EP   3 030 914 B1       1/2020

(Continued)

OTHER PUBLICATIONS

International Search Report corresponding to PCT Application No. PCT/EP2021/070991, mailed Dec. 2, 2021 (German and English language document) (6 pages).

(Continued)

*Primary Examiner* — Paresh Patel
(74) *Attorney, Agent, or Firm* — Maginot, Moore & Beck, LLP (57) ABSTRACT

A calibration apparatus is provided with a calibration card (6) attachable in an insertion opening (E) of a wafer prober (1) to form a corresponding substantially closed space. A calibration temperature probe (60, 61) attached to the calibration card can be approached by a temperature-controlled chuck (3), for clamping the wafer (4) which can be moved by means of a position controller (350) in lateral directions and in height direction. The position controller operates in such a way that the calibration temperature probe (60, 61) can detect a respective current temperature at various positions on the surface (O) of the chuck or on the surface (O') of a wafer (4) clamped thereon. An evaluation device (600), connectable to the calibration temperature probe, a temperature controller (300) and the position controller (350), is arranged to calibrate the temperature output values of the temperature probes (S1-S9) based on the current tempera- (Continued)

tures at the various positions detected by the calibration temperature probe.

15 Claims, 8 Drawing Sheets

(56) References Cited

U.S. PATENT DOCUMENTS

| | | | |
|---|---|---|---|
| 2004/0070415 A1* | 4/2004 | Schneidewind | G01R 31/2887 324/750.03 |
| 2008/0018352 A1 | 1/2008 | Chiba et al. | |
| 2009/0096475 A1 | 4/2009 | Yamamoto et al. | |
| 2009/0315581 A1* | 12/2009 | Rumiantsev | G01R 31/2886 324/756.07 |
| 2015/0219499 A1* | 8/2015 | Waldmann | G01J 5/02 374/1 |
| 2015/0226611 A1* | 8/2015 | Busche | H01L 21/6833 374/121 |
| 2016/0302258 A1 | 10/2016 | Hayashi et al. | |
| 2022/0178993 A1* | 6/2022 | Lee | G01J 5/0007 |

FOREIGN PATENT DOCUMENTS

| | | |
|---|---|---|
| JP | 2003004799 A | 1/2003 |
| JP | 2012231040 A | 11/2012 |
| JP | 2016181601 A | 10/2016 |
| KR | 10-1178884 B1 | 8/2012 |
| WO | 2015018716 A1 | 2/2015 |

OTHER PUBLICATIONS

Notification of Reasons for Refusal for corresponding JP application No. 2023-506004, mailed Jan. 17, 2025 (11 pages) English and Japanese language translations.

* cited by examiner

CALIBRATION ARRANGEMENT AND CORRESPONDING CALIBRATION METHOD, AND CALIBRATION APPARATUS

BACKGROUND

The present invention relates to a calibration arrangement and a corresponding calibration method for calibrating a chuck disposed in a wafer prober, and to a corresponding calibration apparatus.

Nowadays, functional tests of circuits (microchips) integrated in a wafer are carried out on a temperature-controlled chuck in a wafer prober between −60° C. and +300° C. on an increasingly large scale.

Figure 7:
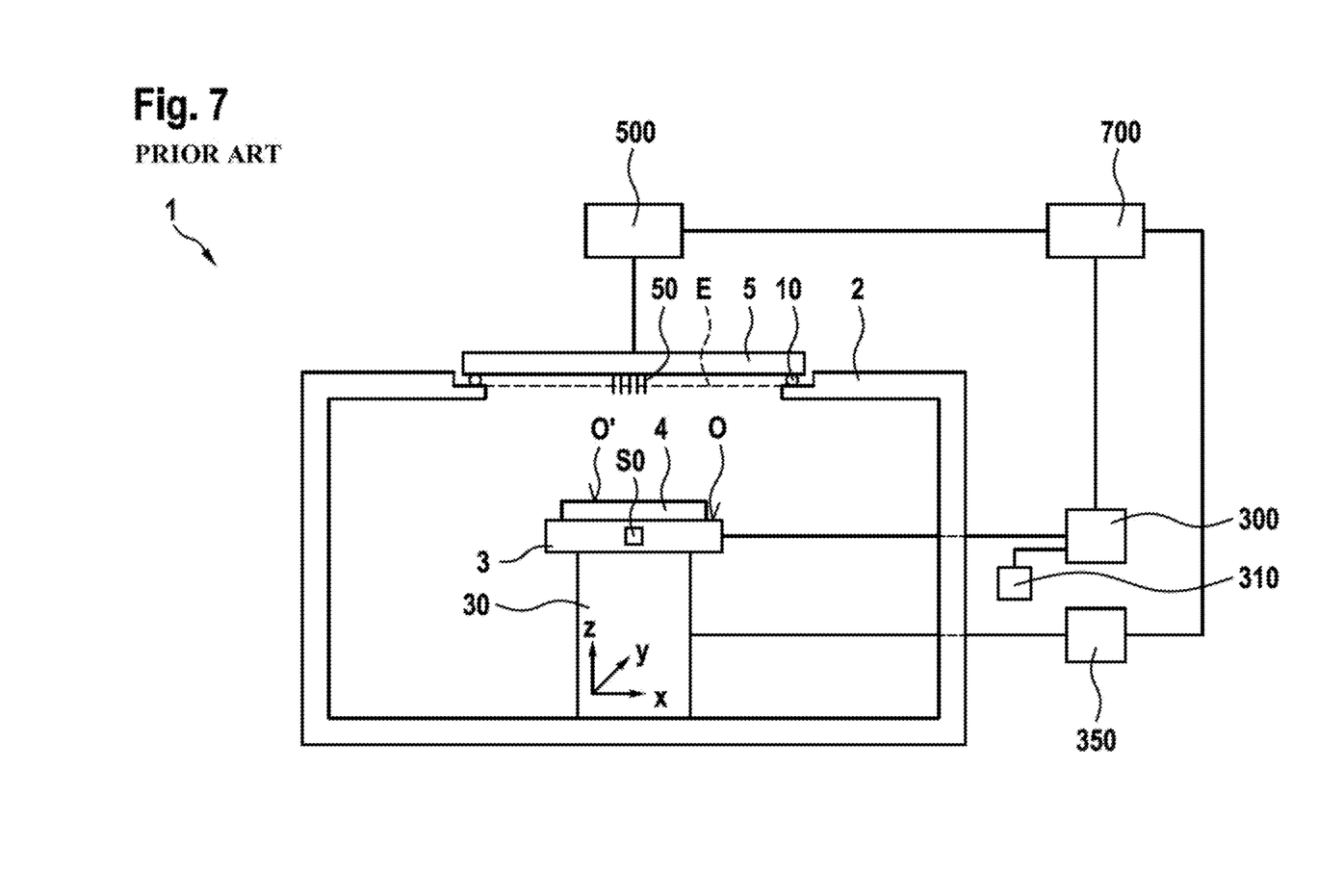
FIG. 7 shows an exemplary wafer prober arrangement.

FIG. 7 shows an exemplary wafer prober arrangement.

In FIG. 7, reference numeral 1 denotes a wafer prober which has a housing 2 with an insertion opening E for the detachable insertion of a test card 5. The test card 5 is sealed from the housing 2 by means of a sealing device 10, for example, so that a substantially closed space is formed in the wafer prober 1 when the test card 5 is inserted. The test card 5 has a plurality of test probes 50 (test needles) for testing integrated circuits (not shown) located on or on the upper surface O' of a wafer 4.

A temperature-controlled chuck 3 for clamping the wafer 4 on its upper side O is arranged in the space 2. This chuck can be moved in the lateral directions x, y and in the height direction z by means of a position controller 350 via an adjustment device 30. The directions x, y, z form an orthogonal Cartesian coordinate system in the present case.

The temperature of the chuck 3 can be adjusted to a set temperature by means of a heating device (not shown) and a cooling device (not shown) via a temperature controller 300. In particular, the cooling device is used to achieve temperatures below room temperature. A temperature probe SO is arranged in the chuck 3 for detecting and outputting a current chuck temperature, the output values being passed to the temperature controller 300 and displayed by an output device 310 connected thereto, e.g. a display. The temperature probe SO may also be used by the temperature controller 300 for temperature regulation.

Reference numeral 700 denotes a probe controller, which is connected to the temperature controller 300, the position controller 350 and a test controller 500. The test controller is used to control the test probes 50 (test needles).

Test programs can be executed via the probe controller 700 and the test controller 500, according to which the test controller 500 controls the test probes 50 with corresponding test performances. Furthermore, the respective set temperature of the temperature controller 300 and the respective set position of the position controller 350 can be specified via the prober controller 700. The corresponding connection lines between the components 5, 500, 700, 300, 310, 3 and 350 are established, for example, via corresponding bus lines and/or analog lines.

Until now, the achievable temperature accuracy of the local chuck temperature at the respective integrated circuit has been in the order of about 2° C. or above. However, new technologies require a higher temperature accuracy down to 0.1° C. or below. Such temperature accuracies can only be achieved by calibrating the test setup used (chuck, wafer prober, test card).

The currently most common method for this is a so-called measuring wafer. This (standard silicon) measuring wafer contains a large number of temperature sensors (usually between 13 and 17 items). These temperature sensors are connected to an evaluation unit. The temperature probes can thus be calibrated. The measuring wafer is placed on the chuck and the temperature accuracy and temperature distribution are displayed.

Another method is to place a single sensor (drop sensor) at various temperature measuring points. The determined values are then entered (usually manually) into compensation tables of the temperature controller.

The disadvantages of the measuring wafer are a limitation of accuracy due to the presence of several sensors or probes and their deviation from each other. Likewise, such a measuring wafer is also usually very expensive.

The disadvantages of the drop sensor are the time required for measurement and the inaccuracy when placing the drop sensor on the surface of the chuck to be measured.

However, the main disadvantage of both methods (and also of all other methods known so far) is that the accuracy of the chuck temperature is determined under different environmental influences than those at the actual test of the chips. In most cases, the wafer is placed on the chuck far away from the calibration location, and even a drop sensor cannot be applied at the later measurement location.

This means that it is actually never possible to determine exactly which temperature is present at which exact location under the microchip under test during the microchip probing process. However, this is exactly the temperature value that is needed during the test. Until now, it has been accurate enough to assume that this value will probably not differ too much from the value determined with the measuring wafer. However, in the accuracy required today, this is no longer sufficient.

From DE 10 2009 030 471 A1 a calibration method for calibrating a chuck as well as a corresponding calibration apparatus are known. Provided is a chuck for receiving and holding a test substrate with an apparatus for receiving and holding a calibration substrate. The chuck comprises a first receiving surface for receiving the test substrate and a second receiving surface, laterally offset with respect to the first receiving surface, for receiving the calibration substrate, the calibration substrate having planar calibration standards for calibrating a measuring unit of a wafer prober and dielectric material or air being arranged below the calibration substrate at least in the region of the calibration standards. In order to be able to take into account the actual thermal conditions on the test substrate and in particular also on the known and unknown calibration standards and thus the thermal influence on the electrical behavior of the calibration standards used, it is proposed to equip the second receiving surface with means for tempering the calibration substrate.

SUMMARY OF THE DISCLOSURE

The present invention provides a calibration arrangement and corresponding calibration method, as well as a calibration apparatus.

The idea underlying the present invention is to provide a calibration apparatus having a calibration card attachable to or integrated in an insertion opening for a test card of a wafer prober, wherein when the calibration card is attached, a corresponding substantially closed space is formed as when the test card is inserted.

The calibration apparatus has a calibration temperature probe attached to the calibration card, which can be approached by the chuck by means of the position controller of the chuck such that the calibration temperature probe can detect a respective current temperature at different positions on the surface of the chuck or on the surface of a wafer mounted thereon.

The calibration apparatus further comprises an evaluation device which is connectable to the calibration temperature probe, the temperature controller and the position controller and which is arranged to calibrate the temperature output values of the one or more temperature probes on the basis of the current temperatures at the various positions detected by the calibration temperature probe.

Advantageously, the chuck temperature can be tested under exactly the same environmental conditions under which the microchip is actually measured later. The temperature probes in the chuck can be calibrated without removal, and the calibration temperature probe can be calibrated easily and independently of the temperature probes in the chuck. The manufacturing effort is significantly less than that of a known measuring wafer. The manual repetition errors of the drop sensor method can be eliminated by the automatic, machine contacting process. The connection of all components with the appropriate software allows a fully automatic calibration. The calibrated temperature probes in the chuck allow permanent monitoring of the temperature distribution during the tests. Likewise, these temperature probes in the chuck enable the exact chuck temperature to be reported back to the wafer prober, which is located under the respective chip being tested in the respective temperature detection sector.

The present invention thus enables a complete, position-related calibration of a chuck as well as a repeated verification of these values by means of a recalibration. The robust design makes it suitable for industrial use, and the components used make it economical.

According to a further preferred further development, the temperature detection device has a single temperature probe, wherein the evaluation device is set up to calibrate the temperature output values of the single temperature probe on the basis of current temperatures at the various positions detected by the calibration temperature probe. This allows for a particularly simple setup.

According to a further preferred embodiment, the temperature detection device has several temperature probes, each temperature probe being assigned a temperature detection sector in the chuck for which it detects and outputs the respective current chuck temperature, wherein the evaluation device is set up to calibrate the temperature output values of the respective temperature probe on the basis of the current temperatures detected by the calibration temperature probe for the assigned temperature detection sector. In this way, the local chuck temperatures can be recorded particularly accurately.

According to another preferred embodiment, the temperature controller comprises a memory device, wherein the evaluation device is arranged to store the calibrated temperature output values of the one or more temperature probes at the various positions in the memory device.

According to another preferred embodiment, the temperature controller comprises an output device, in particular a display device, for outputting the calibrated temperature output values of the one or more temperature probes at the various positions.

According to another preferred embodiment, the calibration temperature probe has a shaft that passes through the calibration card and has a thermal resistor, preferably a Pt100 thermal resistor, attached to the end of the shaft.

According to another preferred embodiment, the calibration temperature probe has a non-contact infrared sensor. This avoids direct surface contact.

According to another preferred embodiment, the calibration temperature probe has a measurement accuracy in the range of 1 mK to 10 mK, in particular in the range of 1 mK to 5 mK, and/or the calibration temperature probe has an area detection range in the range of 10 mm$^2$ to 20 mm$^2$. This enables highly precise detection of the chuck temperature.

According to a further preferred embodiment, the temperature controller is set up to control the setpoint temperature by means of at least one of the calibrated temperature probes. This eliminates the need for a separate regulating probe and provides precise regulating values.

According to another preferred embodiment, the calibration card is integrally formed in one piece with the test card. Thus, one and the same card contains the calibration temperature probe and the test probes, and a card exchange is no longer necessary.

According to a further preferred embodiment, the calibration temperature probe has a height-adjustable shaft guided through the calibration card. This avoids interference from the calibration temperature probe and the test probes.

BRIEF DESCRIPTION OF THE DRAWINGS

Embodiments of the invention are shown in the drawings and explained in more detail in the description below.

In the figures, identical reference numerals denote identical or functionally identical components.

DETAILED DESCRIPTION

Figure 1A:
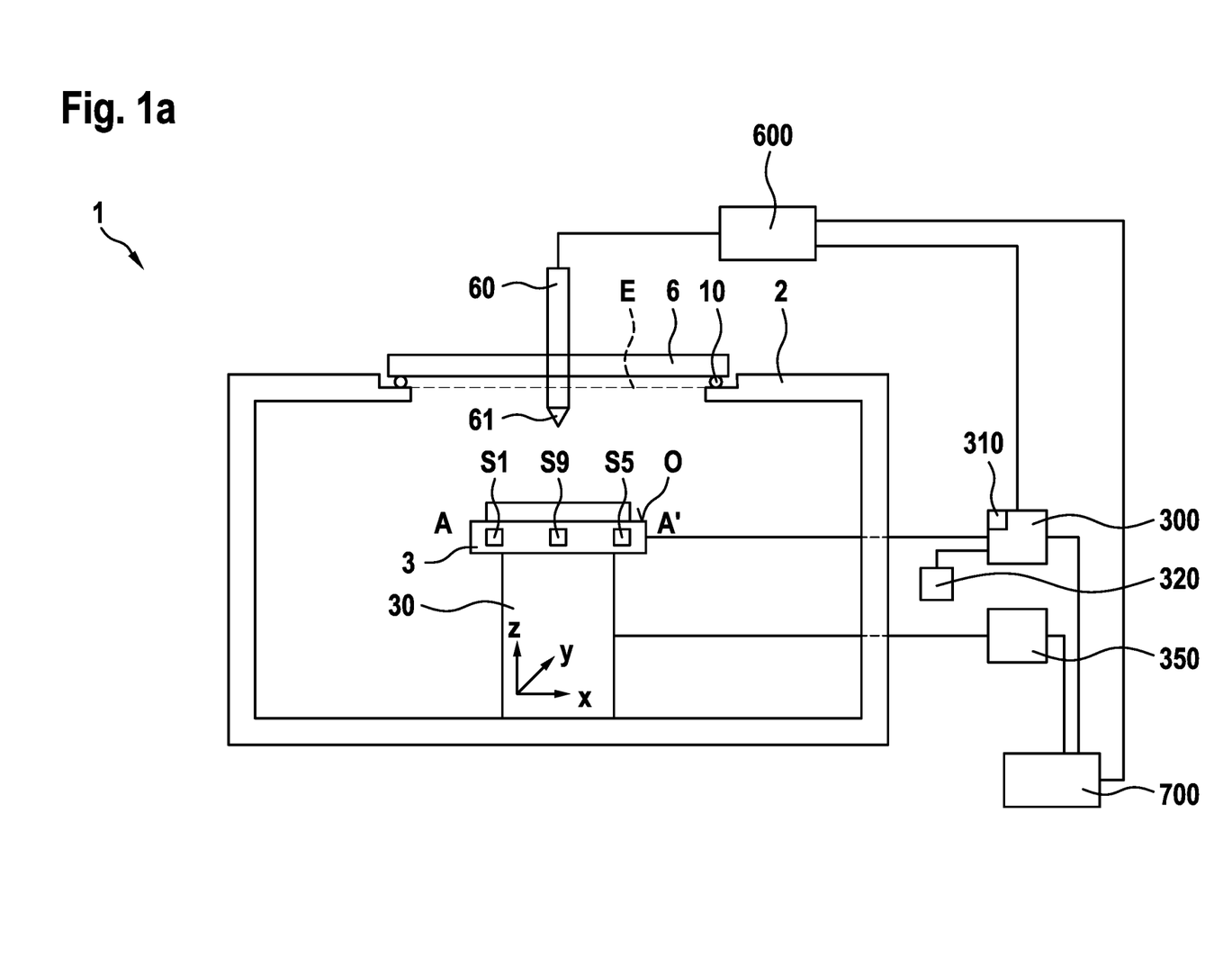
FIG. 1a) shows a calibration arrangement according to a first embodiment of the present invention in an initial state.
Figure 1B:
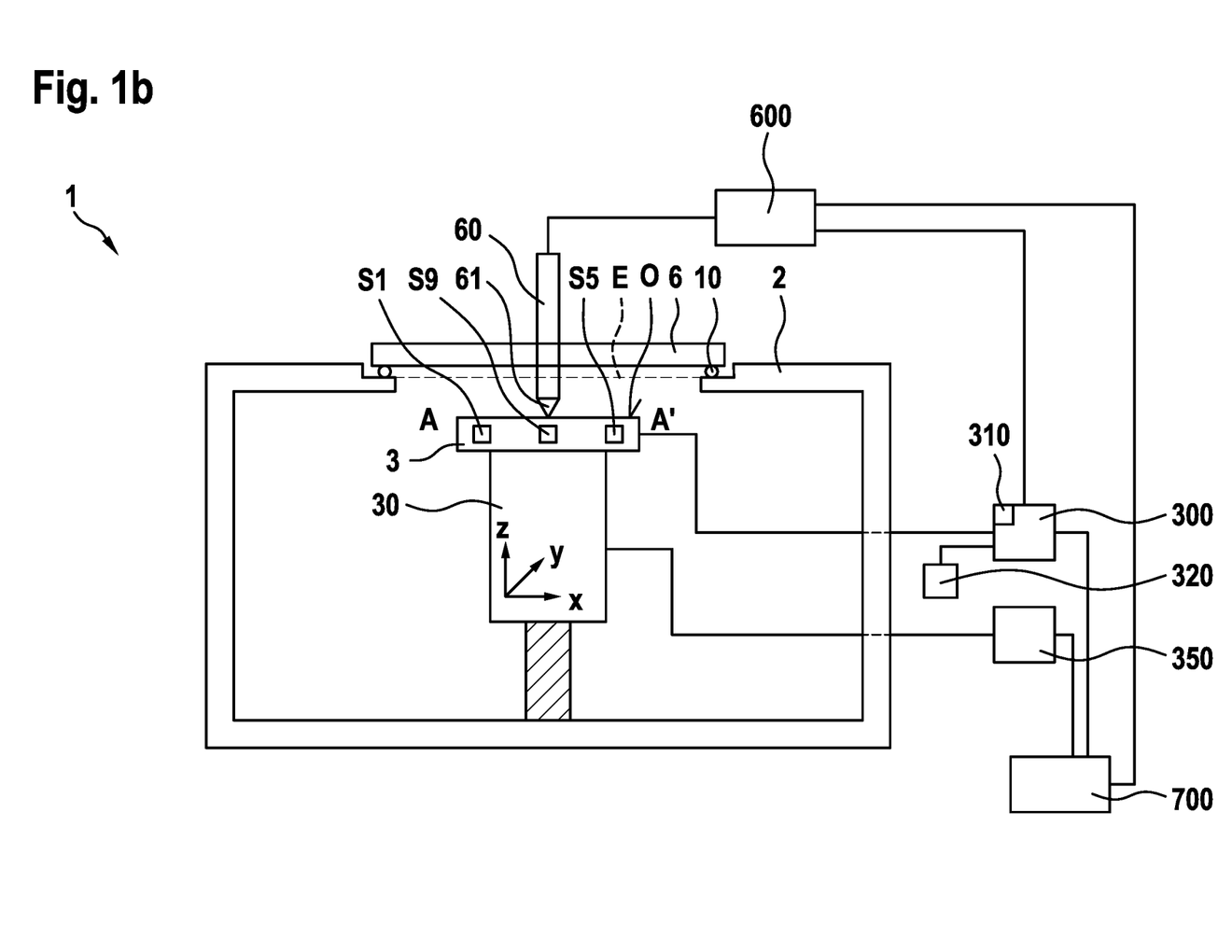
FIG. 1b) shows the calibration arrangement according to the first embodiment of the present invention in a calibration state.

FIG. 1a) illustrates a calibration arrangement according to a first embodiment of the present invention in an initial state before calibration, and FIG. 1b) shows the calibration arrangement according to the first embodiment of the present invention in the calibration state during calibration.

The illustration of the calibration arrangement according to the first embodiment shown in FIG. 1a), b) is analogous to the wafer prober 1 shown in FIG. 7, whereby a calibration card 6 is mounted in the insertion opening E instead of the test card 5 with the test probes 50. In addition, the test controller 500 is not shown since it is not required for calibration.

The calibration card 6 is also sealed from the container 2, for example, via the sealing device 10, so that a corresponding substantially closed space is formed when the calibration card 6 is attached.

In other embodiments not shown, it is also possible for the calibration card 6 to be seated and sealed at the insertion opening E laterally spaced from the insertion opening E.

Depending on the design of the calibration card 6, the size of the corresponding enclosed space may vary slightly from the size of the enclosed space when the test card 5 is inserted, but this is irrelevant to the surrounding conditions of the chuck 3 during calibration, so that these surrounding conditions correspond to the surrounding conditions during testing.

Attached to the calibration card is a calibration temperature probe 60, 61 which can be approached by the chuck 3 by means of the position controller 300 in a calibration mode in such a manner that the calibration temperature probe 60, 61 can detect a respective current temperature at different positions on the surface O of the chuck 3.

In the first embodiment, the calibration temperature probe 60, 61 has a shaft 60 passing through the calibration card 6, at the end of which, located in the space 2, a thermal resistor 61 in the form of a Pt100 thermal resistor is attached, e.g. resiliently.

The calibration temperature probe 60, 61 is connected to an evaluation device 600, which is also connected to the temperature controller 300 and the probe controller 700. The evaluation device 600 is set up to calibrate the temperature output values of a plurality of temperature probes S1 to S9, which in this embodiment are arranged in the chuck 3 instead of the single temperature probe SO (cf. FIG. 2), on the basis of the current temperatures detected by the calibration temperature probe 60, 61 at the various positions. Like the test modes, the corresponding calibration mode can be controlled or entered by the probe controller 700, which is, analogously to FIG. 7, connected to the evaluation device 600 via a network connection and/or analog connection in the same way as the evaluation device 600 is connected to the temperature controller 300.

The temperature controller 300 also includes a non-volatile memory device 310 in which the calibrated temperature output values of the temperature probes S1 to S9 at the various positions on the chuck 3 can be stored.

Figure 2:
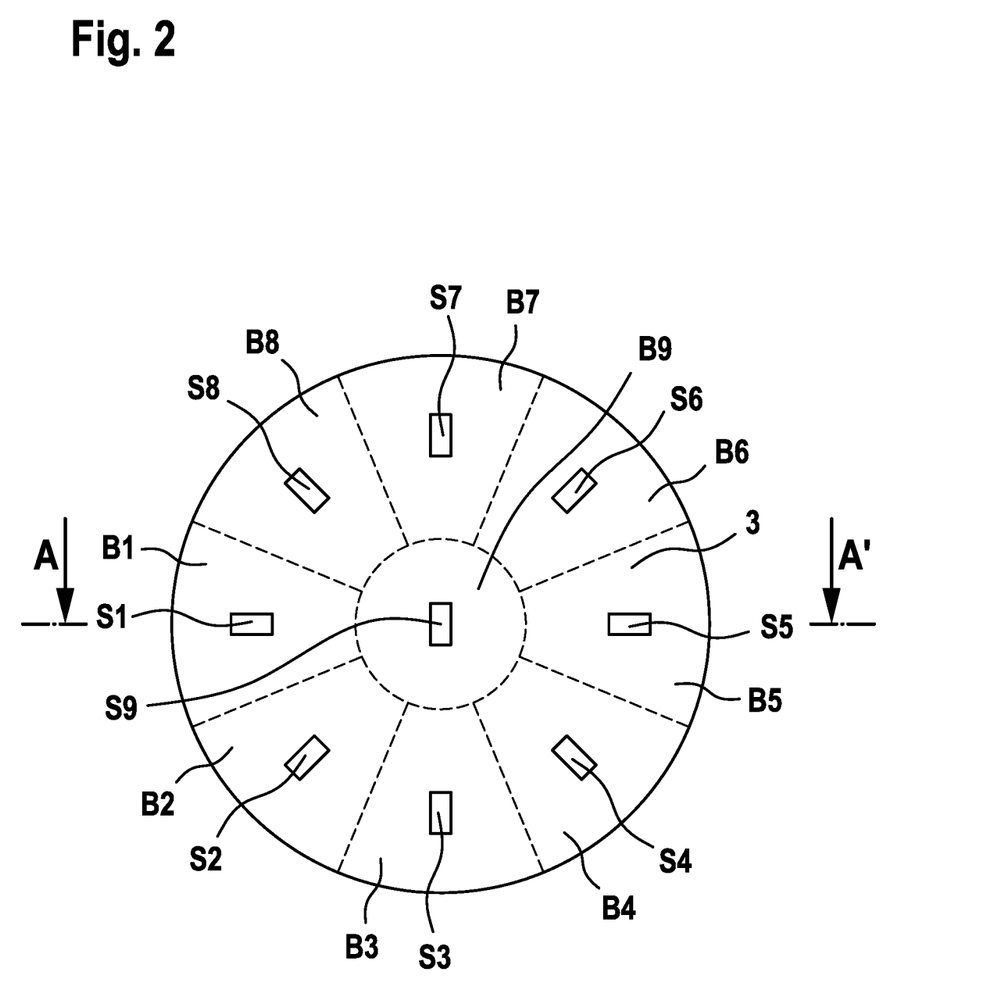
FIG. 2 shows a schematic planar cross-sectional view of the chuck of the first embodiment.

FIG. 2 shows a schematic planar cross-sectional view of the chuck of the first embodiment along line A-A' in FIG. 1a), b).

FIG. 2 shows the arrangement of the temperature probes S1 to S9 in the chuck 3. Each temperature probe S1 to S9 is assigned a corresponding temperature detection sector B1 to B9 in the chuck 3, for which it detects and outputs the respective current chuck temperature. The output device 600 is arranged to calibrate the temperature output values of the respective temperature probe S1 to S9 on the basis of the current temperatures detected by the calibration temperature probe 60, 61 for the associated temperature detection sector B1 to B9 and to store them in the memory device 310 of the temperature controller 300.

The regulation of the entered set temperature by the temperature controller 300 is carried out either by means of a regulating probe (not shown) or by means of one or more of the calibrated temperature sensors S1 to S9. Here, it is possible for the regulation to be performed in each of the temperature sensing sectors B1 to B9 using the respective assigned temperature probe S1 to S9. Another possibility of the regulation is to perform it directed to an average value of all or only the adjacent temperature sensors S1 to S9.

Figure 3:
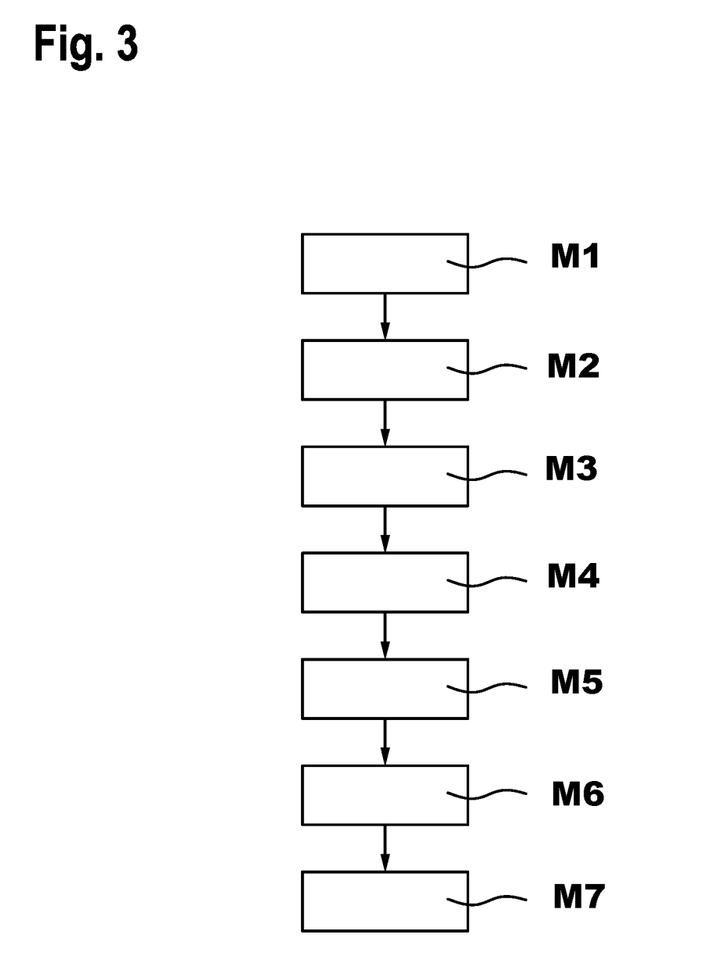
FIG. 3 shows a calibration method according to a second embodiment of the present invention.

FIG. 3 shows a calibration procedure according to a second embodiment of the present invention.

In the calibration method according to FIG. 3, in step M1, the wafer prober 1 is provided with the insertion opening E for inserting the test card 5 with the test probes 50 for testing integrated circuits located on the wafer 4, wherein the substantially closed space is formed when the test card 5 is inserted.

In step M2, the chuck 3, which can be temperature-controlled by the temperature controller 300 to a set temperature, is provided for clamping the wafer 4, the chuck 3 being movable in the lateral directions x, y and in the height direction z by means of the position controller 350.

In step M3, the temperature detection device arranged in the chuck 3 is provided with the one or more temperature probes S1-S9 for detecting and outputting the respective current chuck temperature at the position of the respective temperature probe S1-S9.

In step M4, the calibration card 6 is attached in or at the insertion opening E, wherein a corresponding substantially closed space is formed when the calibration card 6 is attached, wherein the calibration temperature probe 60, 61 is attached to the calibration card 6.

In step M5, the calibration temperature probe 60, 61 is approached by the chuck 3 by means of the position controller 350 and the respective current temperature at various positions on the surface O of the chuck 3 is detected by means of the calibration temperature probe 60, 61.

In step M6, calibration of the temperature output values of the one or more temperature probes S1-S9 is performed based on the actual temperatures detected by the calibration temperature probe 60, 61 at the various positions.

In step M7, storing the calibrated temperature output values of the one or more temperature probes S1-S9 at the various positions, for example, in the storage device 310 of the temperature controller 300 and/or in the probe controller 700, is performed.

Figure 4:
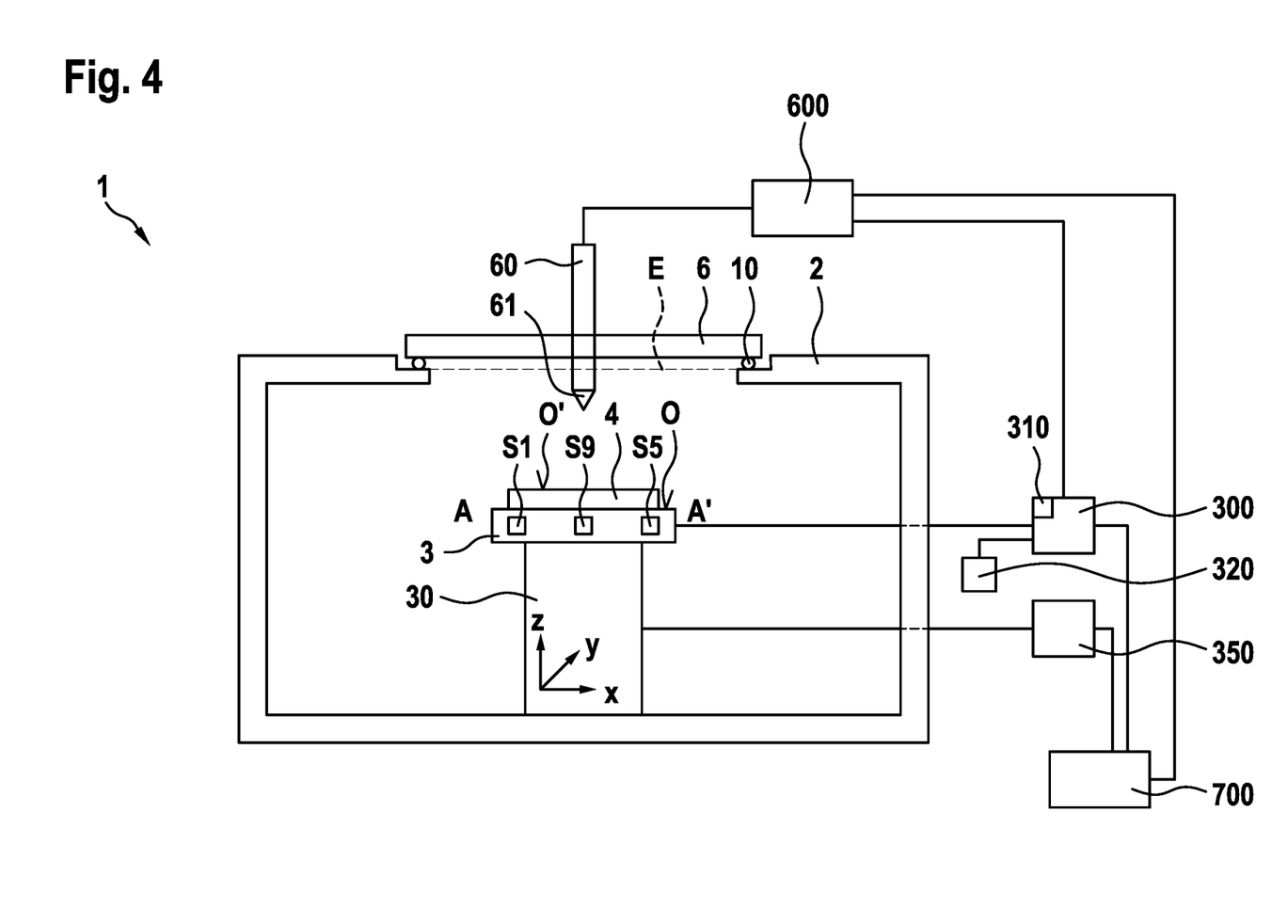
FIG. 4 shows a calibration arrangement according to a third embodiment of the present invention in an initial state.

FIG. 4 shows a calibration arrangement according to a third embodiment of the present invention in its initial state.

The third embodiment according to FIG. 4 differs from the first embodiment in that in calibration mode the respective current temperatures at different positions on the surface O of the chuck 3 are not determined, but with the wafer 4 mounted on the chuck 3, the respective current temperature at various positions on the surface O' of the wafer 4 mounted thereon is recorded. Thus, the temperature at the integrated circuits to be tested can be determined even more precisely, since a possible heat transfer resistance between the chuck 3 and the mounted wafer 4 can be taken into account.

Otherwise, the third embodiment is analogous to the first embodiment.

Figure 5:
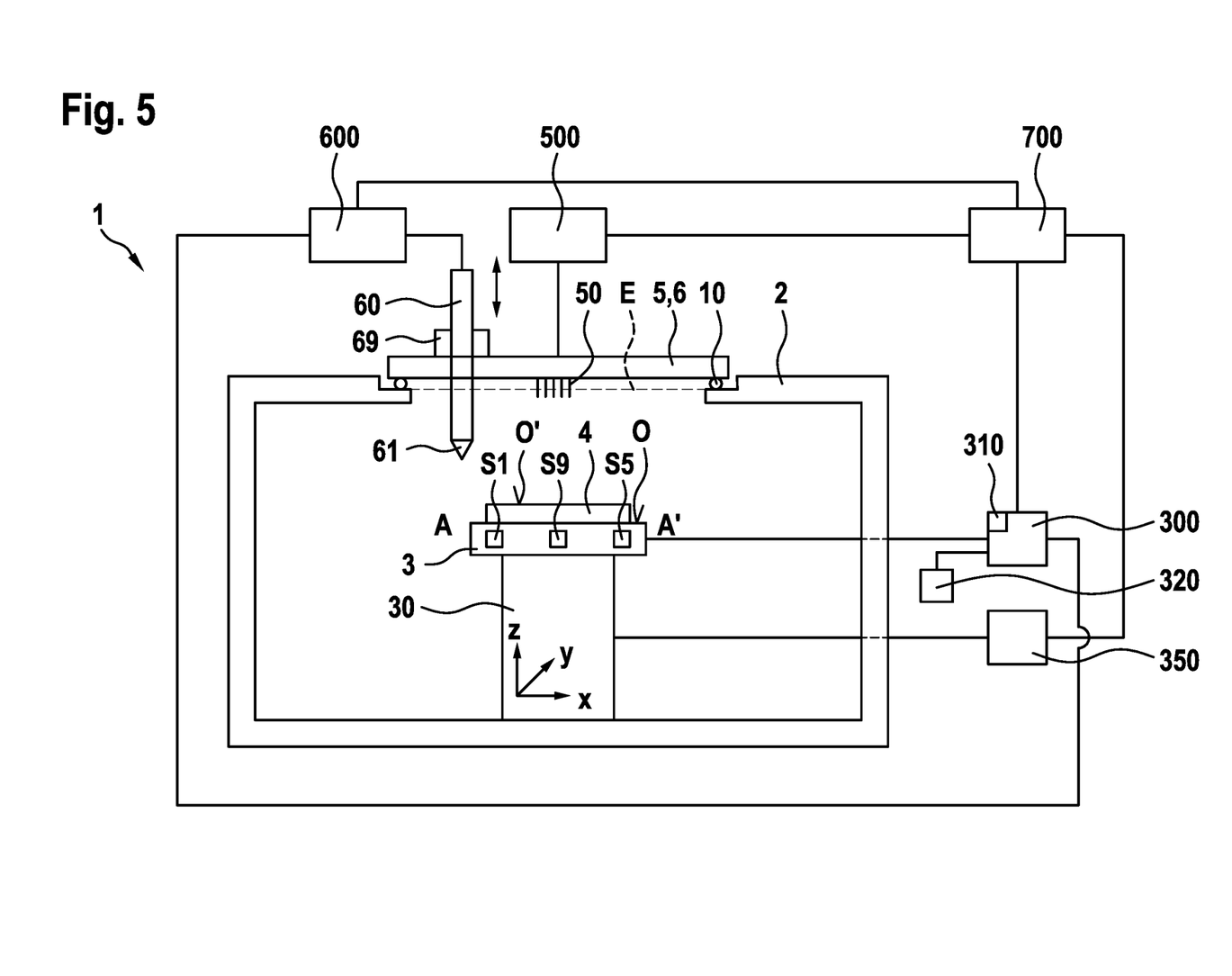
FIG. 5 shows a calibration arrangement according to a fourth embodiment of the present invention in an initial state.

FIG. 5 shows a calibration arrangement according to a fourth embodiment of the present invention in its initial state.

In the fourth embodiment, the calibration card 6 is integrally formed with the test card 5 (in other words, integrated therein). In this embodiment, the calibration temperature probe 60', 61 has a shaft 60' passing through the calibration card 6 or test card 5 so as to be adjustable in height. A corresponding height adjustment can be effected, for example, by means of an adjusting device 69. The height adjustability has the effect that in the test mode the calibration temperature probe 60', 61, which is constructed analogously to the first embodiment, does not interfere with the test probes 50, but can be aligned retracted upwards behind them.

This embodiment has the particular advantage that no exchange of test card 5 and calibration card 6 is required, but only a switchover from test mode to calibration mode by the prober controller 700.

Figure 6:
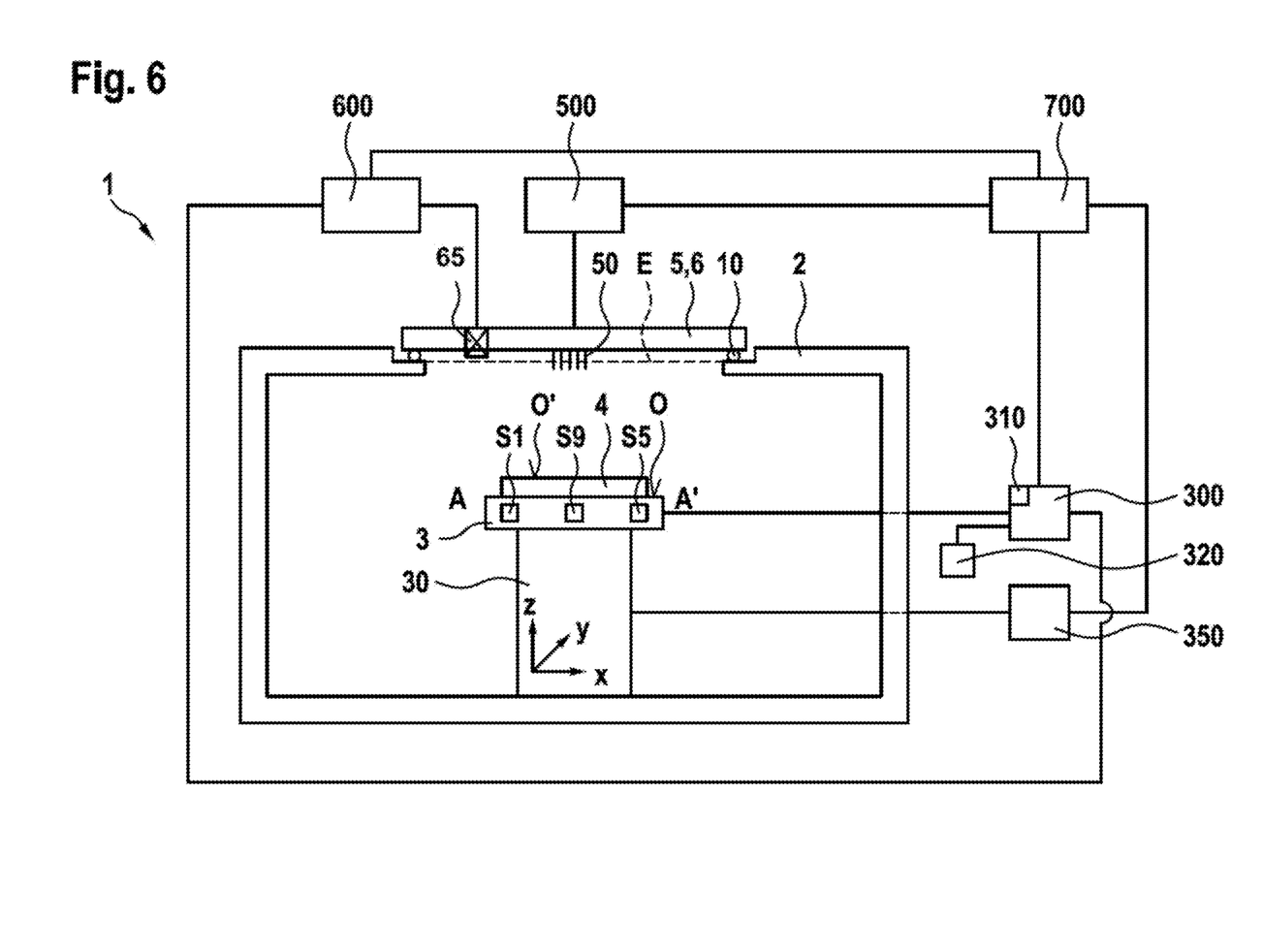
FIG. 6 shows a calibration arrangement according to a fifth embodiment of the present invention in an initial state.

FIG. 6 shows a calibration arrangement according to a fifth embodiment of the present invention in its initial state.

In the fifth embodiment, the calibration card 6 is also integrally formed in one piece with the test card 5. In this embodiment, the calibration temperature probe 65 is a contactless infrared sensor 65 which is connected to the evaluation device 600. As a result, direct surface contact with the surface O' of the wafer 4 or with the surface O of the chuck 3 can be avoided, and height adjustment as in the fourth embodiment can be omitted.

This achieves the additional advantage that calibration or temperature measurement by means of the calibration temperature probe 65 is also possible in situ during testing.

Otherwise, the fifth embodiment is analogous to the fourth embodiment.

Although the present invention has been explained above with reference to preferred embodiments, it is not limited thereto, but can be modified in a variety of ways.

In particular, the number and arrangement of temperature probes in the chuck and their type are exemplary only and not limited to the examples shown.

The invention claimed is:

1. A calibration arrangement for calibrating a chuck, comprising:
    a wafer prober having an insertion opening for inserting a test card having test probes for testing integrated circuits located on a wafer, wherein a substantially closed space is formed when the test card is inserted;
    a chuck, which can be temperature-controlled by a temperature controller to a settable set temperature, for clamping the wafer, wherein the chuck can be moved in lateral directions and in height direction by means of a position controller; and
    a temperature detection device arranged in the chuck with one or more temperature probes for detecting and outputting a respective current chuck temperature at the position of the respective temperature probe;
    a calibration apparatus, including:
        a calibration card attachable in or to the insertion opening, wherein a corresponding substantially closed space is formed when the calibration card is attached;
        a calibration temperature probe attached to the calibration card, which can be approached by the chuck by means of the position controller such that the calibration temperature probe can detect a respective current temperature at various positions on the surface of the chuck or on the surface of a wafer mounted thereon; and
        an evaluation device which is connected to the calibration temperature probe, the temperature controller and the position controller and which is arranged to calibrate the temperature output values of the one or more temperature probes on the basis of the current temperatures at the various positions detected by the calibration temperature probe.

2. The calibration arrangement according to claim 1, wherein the temperature detection means includes a single temperature probe and wherein the evaluation device is arranged to calibrate the temperature output values of the single temperature probe on the basis of current temperatures at the different positions detected by the calibration temperature probe.

3. The calibration arrangement according to claim 1, wherein the temperature detection device has a plurality of temperature probes, wherein each temperature probe is assigned a temperature detection sector in the chuck for which it detects and outputs the respective current chuck temperature, and wherein the evaluation device is set up to calibrate the temperature output values of the respective temperature probe on the basis of the current temperatures for the assigned temperature detection sector detected by the calibration temperature probe.

4. The calibration arrangement according to claim 1, wherein the temperature controller includes a memory device, and wherein the evaluation device is arranged to store the calibrated temperature output values of the one or more temperature probes at the various positions in the memory device.

5. The calibration arrangement according to claim 1, wherein the temperature controller includes an output device, in particular a display device, for outputting the calibrated temperature output values of the one or more temperature probes at the various positions.

6. The calibration arrangement according to claim 1, wherein the calibration temperature probe has a shaft passing through the calibration card at the end of which a thermal resistor, preferably a Pt100 thermal resistor, is attached.

7. The calibration arrangement according to claim 1, wherein the calibration temperature probe comprises includes a non-contact infrared sensor.

8. The calibration arrangement according to claim 1, wherein the calibration temperature probe has a measurement accuracy in the range from 1 mK to 10 mK, in particular in the range from 1 mK to 5 mK, and/or the calibration temperature probe has an area detection range in the range from 10 $mm^2$ to 20 $mm^2$.

9. The calibration arrangement according toe claim 1, wherein the temperature controller is arranged to regulate the set temperature by means of at least one of the calibrated temperature probes.

10. The calibration arrangement according to claim 1, wherein the calibration card is integrally formed in one piece with the test card.

11. The calibration arrangement according to claim 9, wherein the calibration temperature probe includes a shaft passing through the calibration card in a height-adjustable manner.

12. A calibration method for calibrating a chuck comprising the following steps:
    providing a wafer prober having an insertion opening for inserting a test card having test probes for testing integrated circuits located on a wafer, wherein a substantially closed space is formed when the test card is inserted;
    providing a chuck, which can be temperature-controlled by a temperature controller to a settable set temperature, for clamping the wafer, wherein the chuck can be moved by means of a position controller in lateral directions and in height direction; and
    providing of a temperature detection device arranged in the chuck with one or more temperature probes for detecting and outputting a respective current chuck temperature at the position of the respective temperature probe;
    attaching a calibration card in or to the insertion opening, wherein a corresponding substantially closed space is formed when the calibration card is attached, wherein a calibration temperature probe is attached to the calibration card;
    approaching the calibration temperature probe by the chuck by means of the position controller and detecting a respective current temperature at various positions on the surface of the chuck or on the surface of a wafer mounted thereon by means of the calibration temperature probe; and calibrating the temperature output values of the one or more temperature probes based on the current temperatures detected by the calibration temperature probe at the various positions.

13. The calibration method according to claim 12, wherein storing of the calibrated temperature output values of the one or more temperature probes at the various positions is performed.

14. The calibration method according to claim 12, wherein the set temperature is regulated by means of at least one of the calibrated temperature probes.

15. A calibration apparatus for calibrating a chuck, comprising:

a calibration card attachable in or to an insertion opening of a wafer prober, wherein a corresponding substantially closed space is formed when the calibration card is attached;

a calibration temperature probe which is attached to the calibration card and which can be approached by a chuck, which can be temperature-controlled by a temperature controller to a settable set temperature, for mounting the wafer, which chuck can be moved in lateral directions and in height direction by means of a position controller, by means of the position controller in such a way that the calibration temperature probe can detect a respective current temperature at different positions on the surface of the chuck or on the surface of a wafer mounted thereon; and an evaluation device which can be connected to the calibration temperature probe, the temperature controller and the position controller and which is set up to calibrate the temperature output values of the one or more temperature probes on the basis of the current temperatures detected by the calibration temperature probe at the various positions.

\* \* \* \* \*